(12) United States Patent
Otsuki

(10) Patent No.: US 10,547,095 B2
(45) Date of Patent: Jan. 28, 2020

(54) METHOD OF MANUFACTURING DIRECTIONAL COUPLER

(71) Applicants: Kabushiki Kaisha Toshiba, Tokyo (JP); Toshiba Infrastructure Systems & Solutions Corporation, Kanagawa (JP)

(72) Inventor: Shunya Otsuki, Tokyo (JP)

(73) Assignees: Kabushiki Kaisha Toshiba, Tokyo (JP); Toshiba Infrastructure Systems & Solutions Corporation, Kanagawa (JP)

( * ) Notice: Subject to any disclaimer, the term of this patent is extended or adjusted under 35 U.S.C. 154(b) by 7 days.

(21) Appl. No.: 15/823,943

(22) Filed: Nov. 28, 2017

(65) Prior Publication Data

US 2018/0151937 A1    May 31, 2018

(30) Foreign Application Priority Data

Nov. 29, 2016   (JP) ................................ P2016-231595

(51) Int. Cl.
*H01P 5/18* (2006.01)
*H05K 1/18* (2006.01)

(52) U.S. Cl.
CPC ............ *H01P 5/187* (2013.01); *H05K 1/18* (2013.01)

(58) Field of Classification Search
CPC ................................. H01P 5/18; H01P 5/187
USPC ......................................... 333/109–112, 116
See application file for complete search history.

(56) References Cited

U.S. PATENT DOCUMENTS

| | | | | |
|---|---|---|---|---|
| 3,575,674 A * | 4/1971 | Howe, Jr. | ............... | H01P 5/187 333/116 |
| 3,715,689 A * | 2/1973 | Laughlin | ................... | H01P 5/12 333/128 |
| 4,375,053 A * | 2/1983 | Viola | ....................... | H01Q 3/40 333/116 |
| 7,026,884 B2 * | 4/2006 | Vogel | ...................... | H01P 5/187 333/109 |
| 7,088,201 B2 * | 8/2006 | Piernas | ................... | H01P 5/187 333/116 |
| 7,605,676 B2 * | 10/2009 | Dabrowski | ............. | H01P 5/185 333/116 |

(Continued)

FOREIGN PATENT DOCUMENTS

| | | |
|---|---|---|
| CN | 1567648 A | 1/2005 |
| CN | 102938486 A | 2/2013 |

(Continued)

OTHER PUBLICATIONS

Office Action issued in related Chinese application 201710815699. 0, dated Nov. 1, 2019, 12 pages.

*Primary Examiner* — Dean O Takaoka
(74) *Attorney, Agent, or Firm* — Baker Botts L.L.P.

(57) ABSTRACT

A method of manufacturing a broadside-coupled directional coupler including a main line and a sub line which are broadside-coupled to each other is provided. The method includes at least two adjustment processes. A line width of a coupled line part of the sub line on a first surface of a dielectric substrate is adjusted wherein the dielectric substrate having a second surface being opposite to the first surface, and the second surface has a ground plane. A position of a boundary portion where the ground plane and the coupled line are in contact with each other is adjusted.

2 Claims, 4 Drawing Sheets

(56) References Cited

U.S. PATENT DOCUMENTS

| | | | |
|---|---|---|---|
| 7,755,451 B2 * | 7/2010 | Krausse | H01P 5/187 333/116 |
| 2002/0113667 A1 * | 8/2002 | Tahara | H01P 5/185 333/116 |
| 2008/0204162 A1 | 8/2008 | Kubo | |
| 2015/0207199 A1 | 7/2015 | Otsuki et al. | |

FOREIGN PATENT DOCUMENTS

| | | |
|---|---|---|
| EP | 2827441 A | 1/2015 |
| JP | 2003-032013 A | 1/2003 |
| JP | 2013-192084 A | 9/2013 |
| JP | 2014-060535 A | 4/2014 |
| WO | 2005/114777 A1 | 12/2005 |

* cited by examiner

METHOD OF MANUFACTURING DIRECTIONAL COUPLER

BACKGROUND

Technical Field

Embodiments of the present invention generally relate to a method of manufacturing a directional coupler.

Related Art

In related art, a directional coupler generally includes a pair of a main line and a sub line. The main and sub lines can be implemented by patterns of conductor on a substrate. The sub line includes a coupled part which is coupled with the main line. The coupled part will hereinafter be referred to as a coupled line. In general, directivity of the directional coupler would be best in case that the directional coupler is defined so that the coupled line has a line length of $\lambda/4$, where $\lambda$ is the wavelength. Since the value of $\lambda/4$ is large in the ultra-high frequency (UHF) band, the line length of the coupled line would be long in order to ensure the directivity to be sufficiently high. This will increase the scale or size of a circuit of the directional coupler. A shorter coupled line than $\lambda/4$ in order to shrink the scale or size of the circuit of the directional coupler will cause a deterioration in the directivity of the directional coupler, which is a tradeoff relationship between the circuit scale and the directivity of the directional coupler. Japanese Unexamined Patent Application, First Publication No. 2013-192084 discloses the related art of the directional coupler.

DETAILED DESCRIPTION OF THE INVENTION

Hereinafter, a method of manufacturing a directional coupler according to an embodiment will be described with reference to the drawings.

Figure 1:
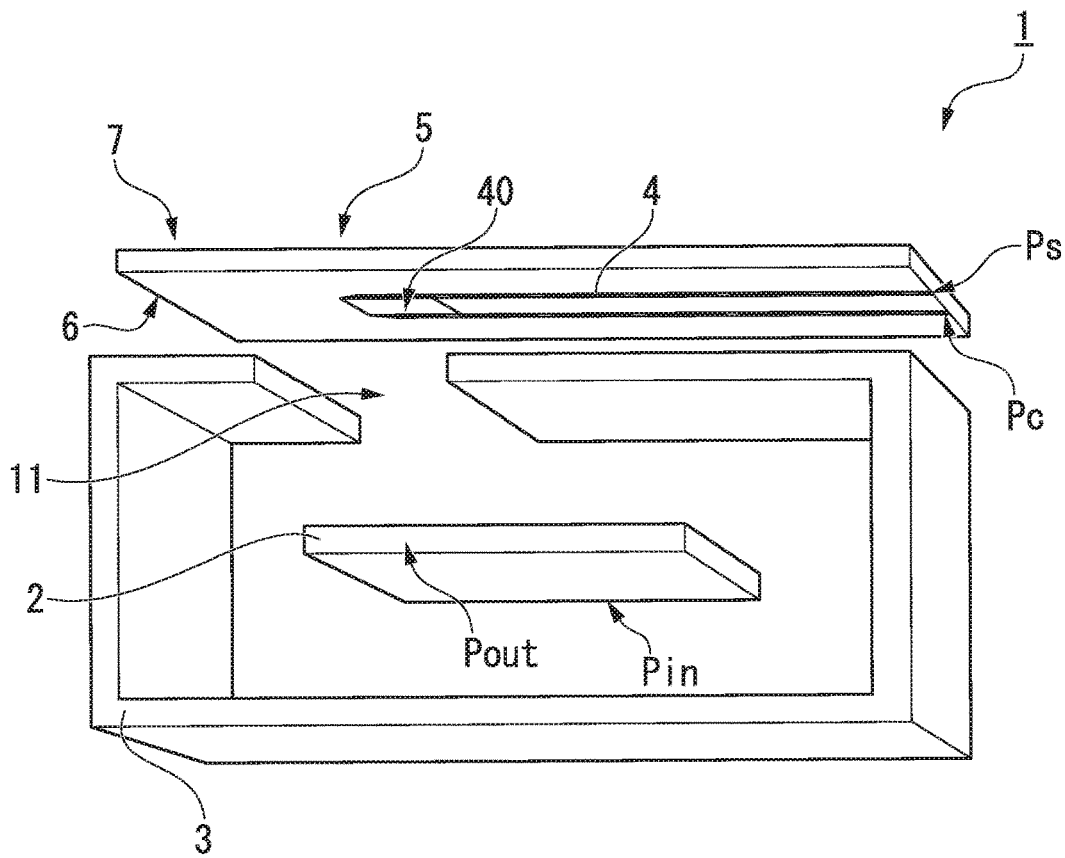
FIG. 1 is a schematic view of a directional coupler according to the embodiment.

FIG. 1 is a view illustrating an example of a schematic configuration of a directional coupler 1 according to the present embodiment.

The directional coupler 1 is a so-called broadside coupled directional coupler.

As illustrated in FIG. 1, the directional coupler 1 includes a main line 2, an outer conductor 3, a coupled line 4, and a substrate 5.

The main line 2 is formed of a metal plate. For example, the main line 2 is a strip line formed of a copper plate.

A slit 11 is formed in the outer conductor 3 in which the main line 2 serves as a central conductor. Also, the coupled line 4 is provided to face an upper portion of the slit 11 and disposed on a plane parallel to the slit 11. Also, the main line 2 includes an input port Pin and an output port Pout. The input port Pin is a port which inputs a high frequency signal to the main line 2. The output port Pout is a port which outputs the high frequency signal from the main line 2.

The coupled line 4 is configured by a micro strip line formed on one surface (a back surface) of the substrate 5 (a dielectric substrate) configured with a dielectric layer, and has a loop antenna shape. The coupled line 4 includes a coupled line 40 which is electromagnetically coupled to the main line 2. Further, a line length Lc of the coupled line 40 is shorter than a wavelength of $\lambda/4$ (Lc ($<<\lambda/4$ wavelength)).

The coupled line 40 of the coupled line 4 is electromagnetically coupled to the main line 2, and thereby extracts a part of a high frequency signal output from the output port Pout of the main line 2.

The coupled line 4 includes a coupled port Pc and an isolation port Ps. The coupled port Pc is provided at one end portion of the coupled line 4. The isolation port Ps is provided at the other end portion of the coupled line 4.

Figure 2:
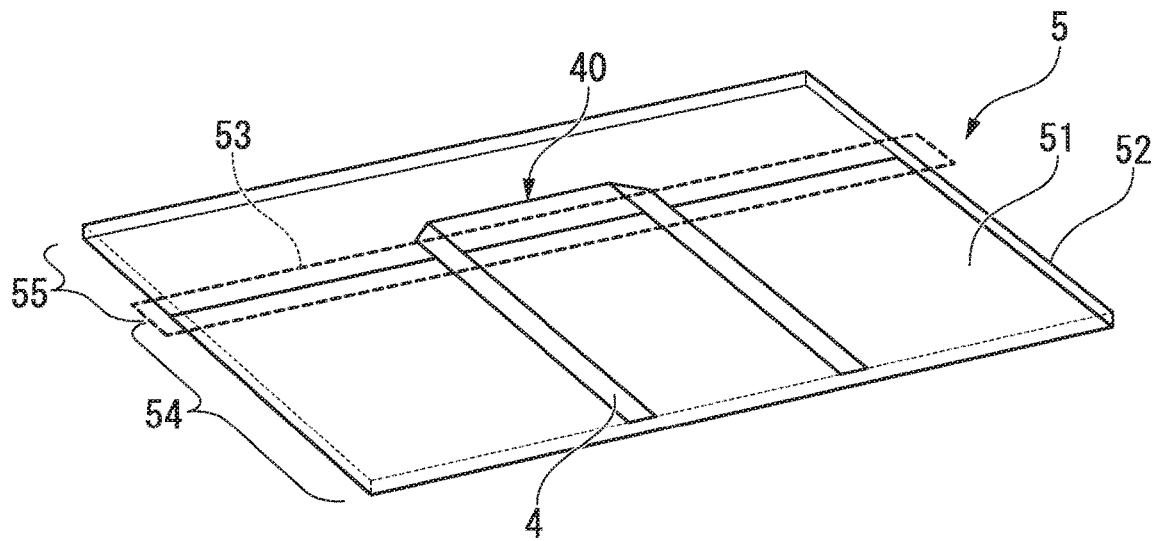
FIG. 2 is a view of a substrate for the directional coupler according to the embodiment.
Figure 3:
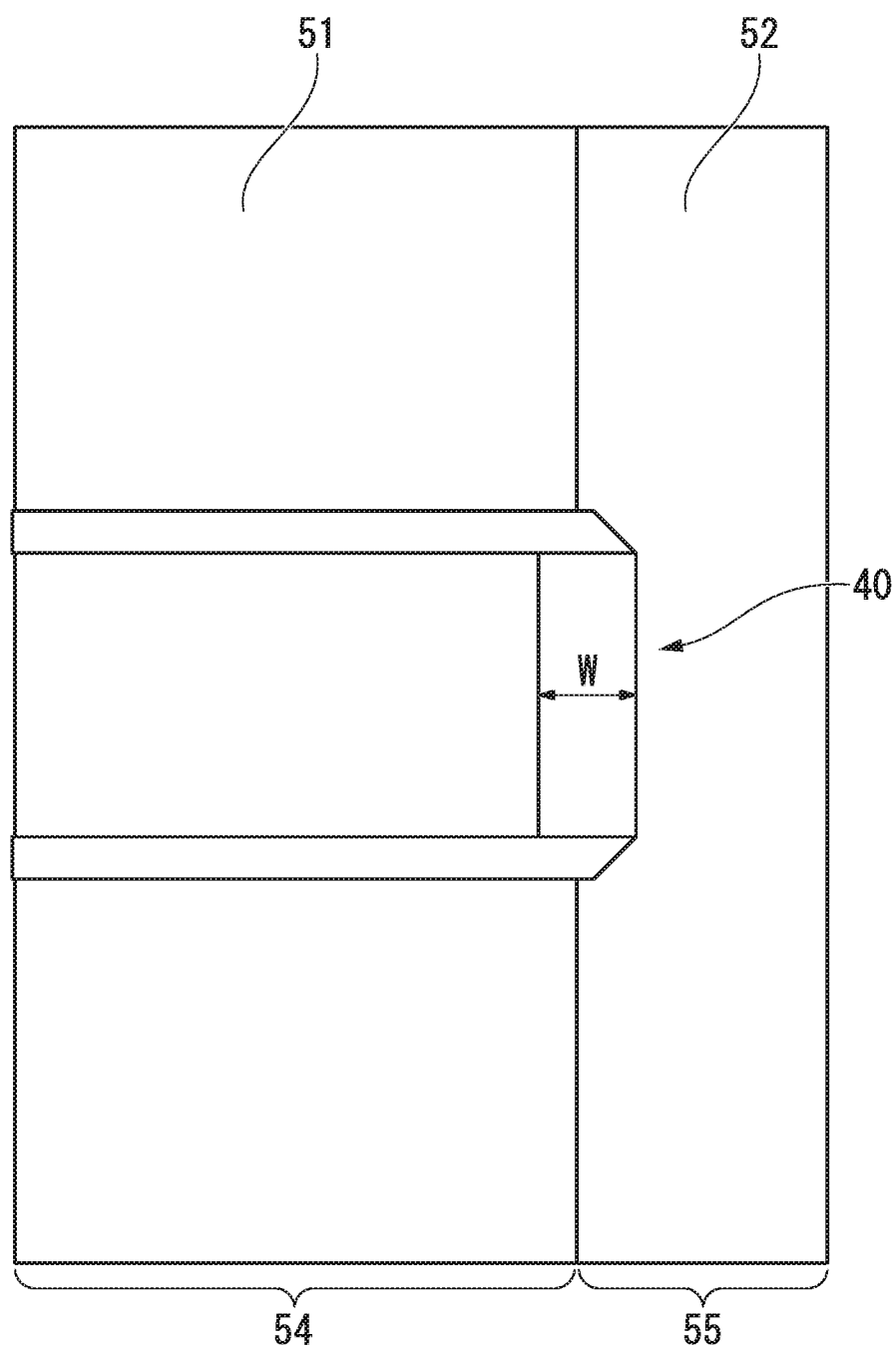
FIG. 3 is a view of a surface of the substrate of the directional coupler according to the embodiment.

FIG. 2 is an external view of the substrate 5 according to the present embodiment. FIG. 3 is an external view of a back surface 6 of the substrate 5 according to the present embodiment.

As illustrated in FIGS. 2 and 3, the coupled line 4 is formed on one surface (a back surface) of the substrate 5, and the other surface (a surface) 7 is a ground plane 52. As described above, the coupled line 40 of the coupled line 4 formed on the back surface 6 is disposed to face the slit 11.

Also, the substrate 5 is roughly divided into a first region 54 and a second region 55 as a whole. A parallel line including at least the coupled port Pc and the isolation port Ps of the coupled line 4 formed on the back surface 6 of a dielectric layer 51 belongs to the first region 54. On the other hand, at least the coupled line 40 of the coupled line 4 formed on the back surface 6 of the dielectric layer 51 belongs to the second region 55.

Therefore, a position of a boundary portion 53 between the first region 54 and the second region 55 moves as the substrate 5 moves in a width direction of the slit 11, and accordingly intensity of electromagnetic field coupling between the main line 2 and the coupled line 40 changes. In addition, the intensity of electromagnetic field coupling between the main line 2 and the coupled line 40 changes according to a change in spatially overlapping area of the slit 11 and the coupled line 40. Thus, directivity of a directional coupler depends on the intensity of electromagnetic field coupling that changes in the manner described above.

Therefore, the method of manufacturing the directional coupler 1 according to the present embodiment includes a process of adjusting the position of the boundary portion 53 indicating the spatial overlap by changing a relative position between the slit 11 and the coupled line 4 (a boundary adjustment process).

In addition, the intensity of electromagnetic field coupling between the main line 2 and the coupled line 40 also changes according to a line width W of the coupled line 40 in the coupled line 4. Therefore, the method of manufacturing the directional coupler 1 according to the present embodiment includes a process of adjusting the line width of the coupled line 40 (a line width adjustment process).

As described above, the method of manufacturing the directional coupler 1 according to the present embodiment includes the process of adjusting the line width W of the coupled line 40 and the position of the boundary portion 53. Thereby, it is possible to finely adjust the intensity of electromagnetic field coupling between the main line 2 and the coupled line 40 and to improve the directivity of the directional coupler. Further, in the following description, the coupled line 4, the substrate 5, and the ground plane 52 which are illustrated in FIGS. 2 and 3 may be collectively referred to as a coupled line portion. The method of manufacturing the directional coupler 1 according to the present embodiment is not limited to the sequential order of the boundary adjustment process and the line width adjustment process.

Figure 4:
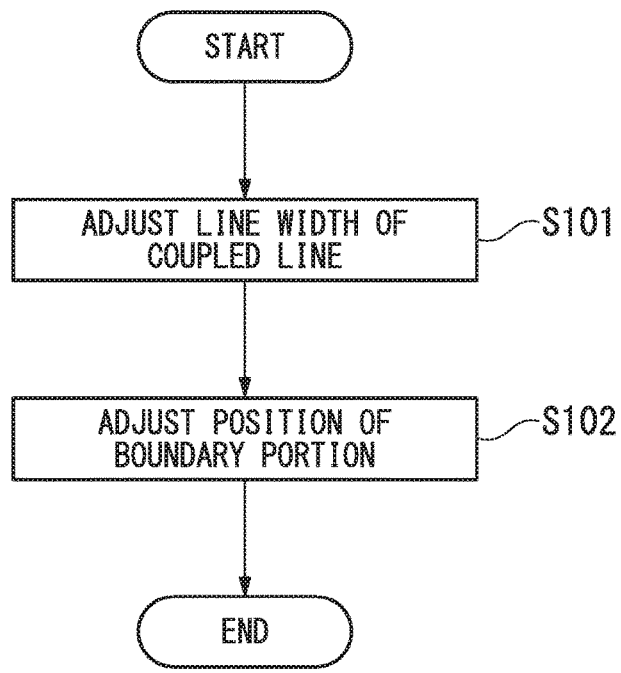
FIG. 4 is a view of a process for pre-manufacturing simulation of the directional coupler in steps involved, prior to manufacturing the directional coupler, according to the embodiment.

FIG. 4 is a view illustrating a flow of a simulation prior to the manufacture of the directional coupler 1 according to the present embodiment. As illustrated in FIG. 4, in manufacture of the directional coupler 1, in the dielectric substrate 5 having the coupled line 4 formed on one surface and the ground plane 52 formed on the other surface, a simulation for adjusting the line width W of the coupled line 40 in the coupled line 4 is performed (step S101). Also, a simulation for adjusting the position of the boundary portion 53 in which the ground plane 52 and the coupled line 4 are in contact with each other is performed (step S102).

In practice, the simulation is performed until a shape that can obtain optimum characteristics is obtained while appropriately repeating the two steps S101 and S102. A directional coupler optimized through such a simulation can be manufactured by the manufacturing method based on the flow of FIG. 4.

Figure 5:
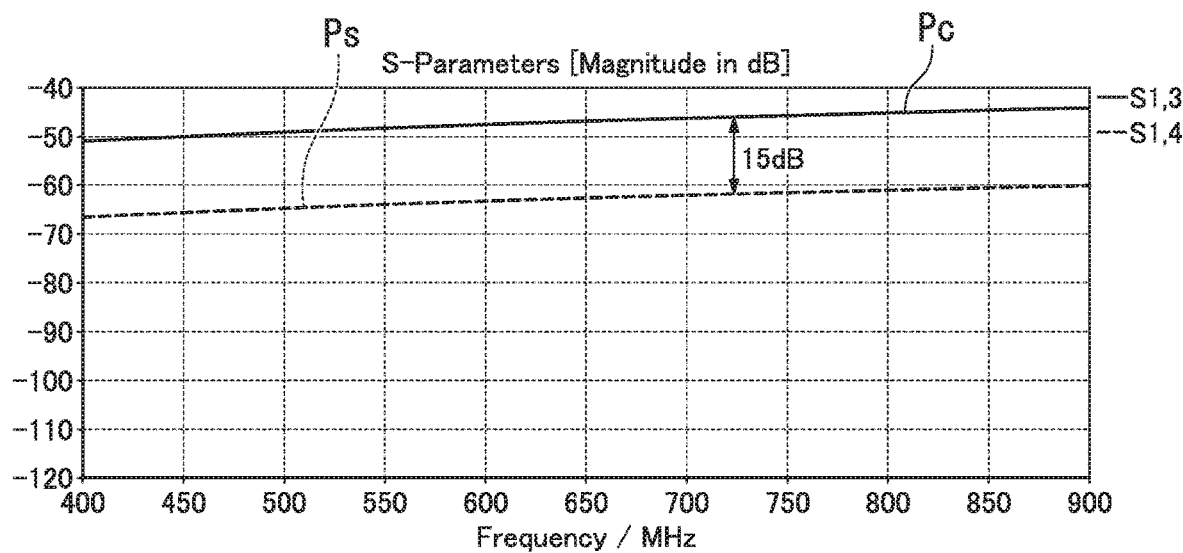
FIG. 5 is a view illustrating simulation results of S parameters of a coupled port and an isolated port for specific frequencies according to a conventional directional coupler.
Figure 6:
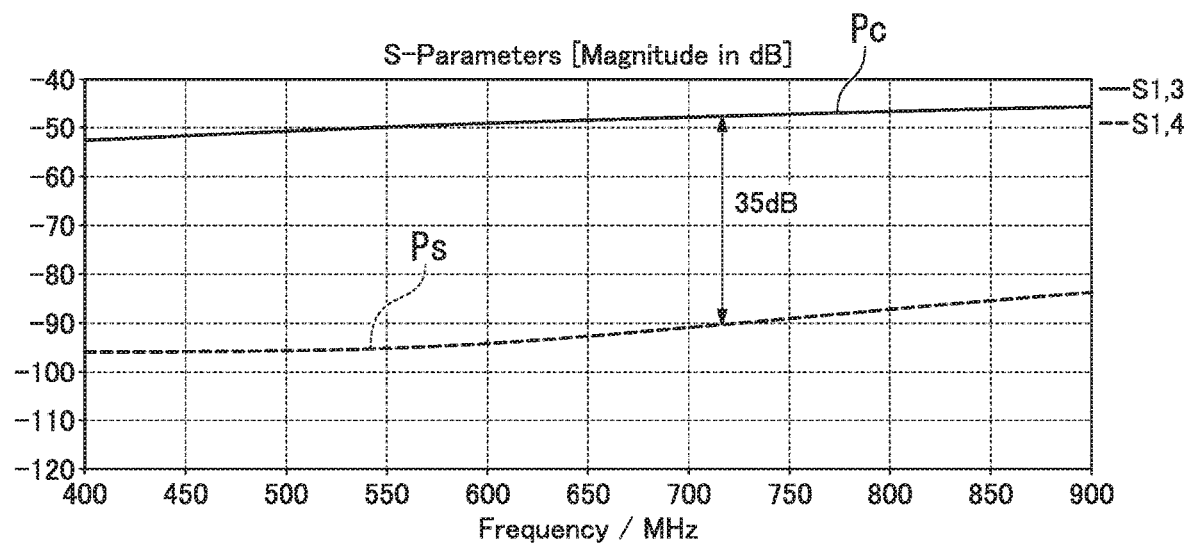
FIG. 6 is a view illustrating simulation results of S parameters of a coupled port and an isolation port for specific frequencies according to the directional coupler 1 of the present embodiment.

FIG. 5 is a view illustrating simulation results of S parameters of a coupled port and an isolation port for specific frequencies according to a conventional directional coupler. This conventional directional coupler is a broadside coupled directional coupler having a structure in which the boundary portion 53 in the directional coupler 1 is not provided and a line width of a coupled line in a coupled line 300 is not adjusted. FIG. 6 is a view illustrating simulation results of S parameters of a coupled port and an isolation port for specific frequencies according to the directional coupler 1 according to the present embodiment.

Here, as expressed in the following Equation (1), a directivity D of a directional coupler can be calculated from a difference between a degree of coupling I of the coupled port Pc from the input port Pin and a degree of coupling C of the isolation port Ps from the input port Pin.

$$\text{Directivity } D=|I-C|[\text{dB}] \quad (1)$$

Therefore, in the conventional directional coupler, when the directivity D is calculated by above Equation (1) from the results of FIG. 5, it is ascertained that the directivity of about 15 dB can be obtained.

On the other hand, in the directional coupler 1 according to the present embodiment, when the directivity D is calculated by above Equation (1) from the results of FIG. 6, the directivity of 35 dB or more can be obtained. Accordingly, it is ascertained that the directional coupler 1 has a remarkably improved directivity D compared to the conventional directional coupler.

According to at least one embodiment described above, in the dielectric substrate 5 having the coupled line 4 formed on one surface 6 and the ground plane 52 formed on the other surface 7, the directivity of the directional coupler 1 can be improved through the process of adjusting the line width W of the coupled line 40 in the coupled line 4 and the process of adjusting the position of the boundary portion 53 in which the ground plane 52 and the coupled line 4 are in contact with each other.

In addition, the directional coupler 1 described above can obtain high directivity even without the line length of λ/4 in the coupled line 40. Therefore, it is possible to reduce a size of the directional coupler 1.

While preferred embodiments of the present invention have been described, it should be understood that these embodiments are exemplary of the invention and are not to be considered as limiting the scope of the invention. The embodiments may be implemented in many other different forms, and various omissions, substitutions, and other modifications can be made without departing from the spirit or scope of the invention. The embodiments and modifications thereof should be regarded as being included within the scope and spirit of the invention and included in the invention described in the claims and equivalent scope thereof.

What is claimed is:

1. A method of manufacturing a broadside-coupled directional coupler including a main line and a sub line which are broadside-coupled to each other, the method comprising:
    adjusting a line width of a coupled line part of the sub line on a first surface of a dielectric substrate, wherein the dielectric substrate has a second surface being opposite to the first surface, the second surface has a ground plane; and
    adjusting a position of a boundary portion where the ground plane and the coupled line are spatially overlapped with each other,
    wherein adjusting the position comprises:
    moving the dielectric substrate in a width direction of a slit of an outer conductor having the main line as a central conductor to change a relative position between the slit and the coupled line part.

2. The method of manufacturing a directional coupler according to claim 1, wherein the main line comprises a metal plate.

* * * * *